(12) United States Patent
Kim

(10) Patent No.: US 7,294,924 B2
(45) Date of Patent: Nov. 13, 2007

(54) FLAT PANEL DISPLAY DEVICE AND METHOD OF FABRICATING THE SAME

(75) Inventor: Tae-Sung Kim, Inceon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/010,274

(22) Filed: Dec. 14, 2004

(65) Prior Publication Data

US 2005/0133793 A1    Jun. 23, 2005

(30) Foreign Application Priority Data

Dec. 22, 2003  (KR)  .................. 10-2003-0094815

(51) Int. Cl.
*H01L 23/10* (2006.01)
*H01L 23/34* (2006.01)

(52) U.S. Cl. ..................... 257/707; 257/706

(58) Field of Classification Search ............... 257/765, 257/767, 359, 706, 707
See application file for complete search history.

(56) References Cited

U.S. PATENT DOCUMENTS

| | | | |
|---|---|---|---|
| 5,061,985 A * | 10/1991 | Meguro et al. ............. | 257/751 |
| 5,719,446 A * | 2/1998 | Taguchi et al. ............. | 257/751 |
| 5,804,878 A * | 9/1998 | Miyazaki et al. ............ | 257/764 |
| 6,133,968 A | 10/2000 | Asada | |
| 6,157,082 A * | 12/2000 | Merchant et al. ............ | 257/758 |
| 6,255,706 B1 | 7/2001 | Watanabe et al. | |
| 6,486,555 B2 * | 11/2002 | Asahina et al. .............. | 257/751 |
| 2001/0002050 A1 | 5/2001 | Kobayashi et al. | |
| 2002/0109797 A1 * | 8/2002 | Chung et al. ................ | 349/43 |
| 2003/0086045 A1 | 5/2003 | Ono et al. | |
| 2003/0169380 A1 | 9/2003 | Arao | |
| 2004/0135143 A1 | 7/2004 | Harano et al. | |

FOREIGN PATENT DOCUMENTS

| | | |
|---|---|---|
| EP | 1 005 094 A2 | 5/2000 |
| JP | 3-240027 | 10/1991 |
| JP | 2000-147550 | 5/2000 |
| JP | 2000-307118 | 11/2000 |
| JP | 2002-203973 | 7/2002 |
| JP | 2003-45966 | 2/2003 |
| JP | 2003-140188 | 5/2003 |
| JP | 2003-186422 | 7/2003 |
| KR | 10-2000-0057733 | 9/2000 |

* cited by examiner

*Primary Examiner*—S. V. Clark
(74) *Attorney, Agent, or Firm*—H.C. Park & Associates, PLC

(57) ABSTRACT

The flat panel display device may include a substrate and source/drain electrodes having a heat-resistant metal layer pattern, an Al-based metal layer pattern and a capping metal layer pattern, deposited on the substrate. With this design, the flat panel display device may have low wiring resistance, thermal stability and improved contact resistance with the pixel electrode.

15 Claims, 9 Drawing Sheets

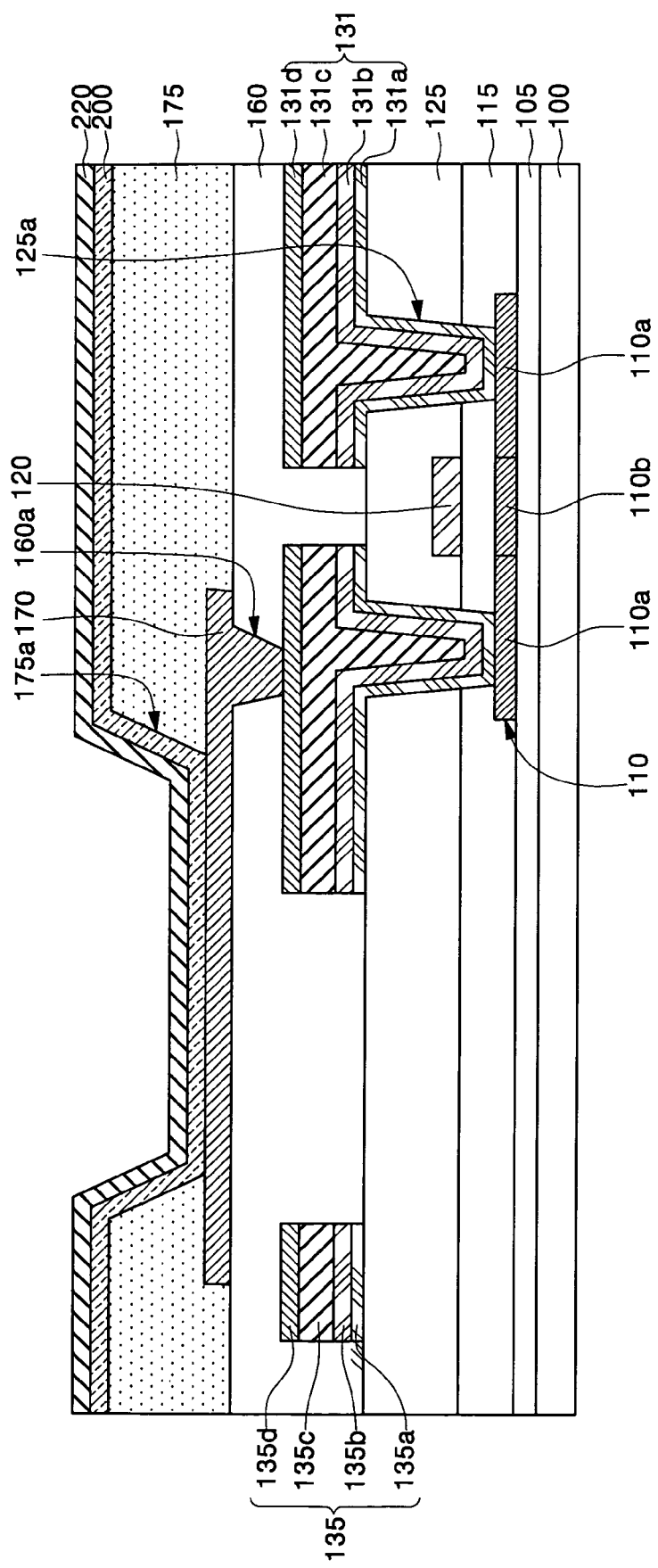

FLAT PANEL DISPLAY DEVICE AND METHOD OF FABRICATING THE SAME

CROSS-REFERENCE TO RELATED APPLICATION

This application claims the benefit of Korean Patent Application No. 2003-94815, filed Dec. 22, 2003, the disclosure of which is incorporated herein by reference in its entirety.

BACKGROUND OF THE INVENTION

1. Field of the Invention

The present invention relates to a flat panel display device and method of fabricating the same and more particularly to an active matrix flat panel display device and method of fabricating the same.

2. Description of the Related Art

An active matrix flat panel display device may include unit pixels arranged in a matrix form. For an active matrix flat panel display device, each unit pixel may include at least one thin film transistor (TFT), a pixel electrode controlled by the TFT, and an opposite electrode facing the pixel electrode. An organic light-emitting device is a device in which an organic emission layer is interposed between a pixel electrode and an opposite electrode. In contrast, a liquid crystal device is a device in which a liquid crystal layer is interposed between the pixel electrode and the opposite electrode.

FIG. 1 is a cross-sectional view illustrating a TFT of a flat panel display device according to the prior art.

As shown in FIG. 1, a semiconductor layer 20 may be formed on a substrate 10. A gate insulating layer 30 covering the semiconductor layer 20 may be formed on the semiconductor layer 20. A gate electrode 40 may be formed on the gate insulating layer 30. An interlayer 50 that covers the gate electrode 40 may be formed. Contact holes 50a that expose both ends of the semiconductor layer 20 may be formed in the interlayer 50. Source/drain electrodes 55 located on the interlayer 50 and contacting both ends of the semiconductor layer 20 through the contact holes 50a may be formed. In forming the source/drain electrodes 55, a signal wiring of the flat panel display device (not shown) can be formed together.

The source/drain electrodes 55 and the signal wiring may be formed of Mo. However, the Mo has high specific resistance. This means that it may increase wiring resistance of the signal wiring, creating a signal delay in the signal wiring. The signal delay may cause image quality degradation in a flat panel display.

To address this, there was an attempt to form the source/drain electrodes 55 and the signal wiring with a double layer including a Mo layer and a low-resistance Al layer on the Mo layer. However, if any of the source/drain electrodes 55 contacts an ITO layer (such as the pixel electrode (not shown)), an oxide layer can form between the Al layer and the ITO layer. Thus, the contact resistance between the pixel electrode and the source/drain electrode 55 can be increased.

SUMMARY OF THE INVENTION

The present invention provides a flat panel display device including a source/drain electrode having low wiring resistance, thermal stability and improved contact resistance with the pixel electrode.

An aspect of the present invention provides a flat panel display device. The flat panel display comprises a substrate; and source and drain electrodes having a heat-resistant metal layer pattern, an Al-based metal layer pattern and a capping metal layer pattern, deposited on the substrate.

Preferably, the heat-resistant metal layer pattern is at least one metal layer such as, for example, a Cr layer, a Cr alloy layer, a Mo layer, and a Mo alloy layer. More preferably, the heat-resistant metal layer pattern may be a MoW alloy layer.

Preferably, the Al-based metal layer pattern is at least one metal layer such as, for example, an Al layer, an AlSi layer, an AlNd layer, and an AlCu layer. More preferably, the Al-based metal layer pattern is AlSi layer.

Preferably, the capping metal layer pattern is Ti layer or Ta layer.

The flat panel display device further comprises a diffusion barrier pattern interposed between the heat-resistant metal layer pattern and the Al-based metal layer pattern. More preferably, the diffusion barrier pattern is any one layer of Ti layer or Ta layer.

The heat-resistant metal layer pattern has a thickness of at least 1000 Å. Contrary to this, the heat-resistant metal layer pattern is 500 Å thick or less when the flat panel display device further comprises a diffusion barrier pattern interposed between the heat-resistant metal layer pattern and the Al-based metal layer pattern.

More preferably, the flat panel display device further comprises a semiconductor layer located on the substrate, a gate electrode located on the semiconductor layer, and an interlayer located on the gate electrode and the semiconductor layer and having source/drain contact hole that expose end part of the semiconductor layer. Here the heat-resistant metal layer pattern, the Al-based metal layer pattern and the capping metal layer pattern may be located on the exposed semiconductor layer. Preferably, the semiconductor layer is a polysilicon layer.

Another aspect of the present invention provides a method of fabricating a flat panel display device. The method of fabricating the flat panel display device comprises the steps of forming a semiconductor layer on the substrate, forming a gate electrode on the semiconductor layer, forming an interlayer that covers the gate electrode and the semiconductor layer, forming source/drain contact hole that expose end part of the semiconductor layer in the interlayer, and forming source/drain electrodecontacting end part of the semiconductor layer through the source/drain contact hole and having a heat-resistant metal layer pattern, an Al-based metal layer pattern and a capping metal layer pattern, deposited.

The step of forming the source/drain electrode includes the sub-steps of depositing a heat-resistant metal layer on the exposed semiconductor layer and patterning the heat-resistant metal layer to form the heat-resistant metal layer pattern, depositing an Al-based metal layer on the heat-resistant metal layer pattern, depositing a capping metal layer on the Al-based metal layer, and patterning the capping metal layer and the Al-based metal layer to form the Al-based metal layer pattern and the capping metal layer pattern deposited on the heat-resistant metal layer pattern. Preferably, before depositing the Al-based metal layer, the substrate where the heat-resistant metal layer pattern is formed is heat-treated. Preferably, before heat-treating the substrate, a passivation layer is deposited on the heat-resistant metal layer pattern, and after heat-treating and before depositing the Al-based metal layer, the passivation layer is removed.

Contrary to this, the step of forming the source/drain electrode includes the sub-steps of: depositing a heat-resistant metal layer, an Al-based metal layer and a capping metal layer on the exposed semiconductor layer; and patterning the capping meal layer, the Al-based metal layer and the heat-resistant metal layer to form the heat-resistant metal layer pattern, the Al-based metal layer pattern and the capping metal layer pattern. Here, the heat-resistant metal layer is formed 500 Å thick or less. Further, in this case, the method of fabricating the flat panel display device further comprises: before depositing the Al-based metal layer, forming a diffusion barrier on the heat-resistant metal layer; wherein the step of forming the heat-resistant metal layer pattern, the Al-based metal layer pattern and the capping metal layer pattern is performed while forming a diffusion barrier pattern, by patterning the capping metal layer, the Al-based metal layer, the diffusion barrier and the heat-resistant metal layer. Preferably, the method of fabricating the flat panel display device further comprises the step of: before depositing the Al-based metal layer, heat-treating the substrate where the heat-resistant metal layer is formed. Preferably, the method further comprises the steps of: before heat-treating the substrate, depositing a passivation layer on the heat-resistant metal layer; and after heat-treating and before depositing the Al-based metal layer, removing the passivation layer.

BRIEF DESCRIPTION OF THE DRAWINGS

FIGS. 3A, 3B, 3C, and 3D are cross-sectional views for illustrating a method of fabricating a flat panel display device according to a second embodiment of the present invention.

DETAILED DESCRIPTION OF THE INVENTION

Figure 1:
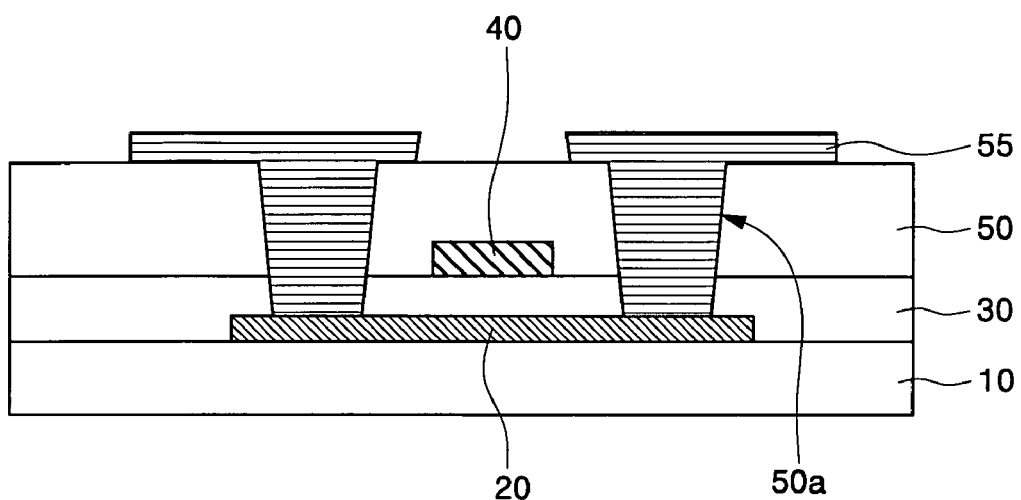
FIG. 1 is a cross-sectional view illustrating a TFT of a flat panel display device is according to the prior art.

The present invention will now be described more fully with reference to the accompanying drawings, in which preferred embodiments of the invention are shown. This invention may, however, be embodied in different forms and should not be construed as limited to the embodiments set forth herein. In the drawings, when one layer is shown as located "on" another layer or a substrate, one should understand that this means that one layer can be directly formed on the other layer of the substrate or another (third or more) layer can be interposed between these layers. Like numbers refer to like elements throughout the specification.

Figure 2A:
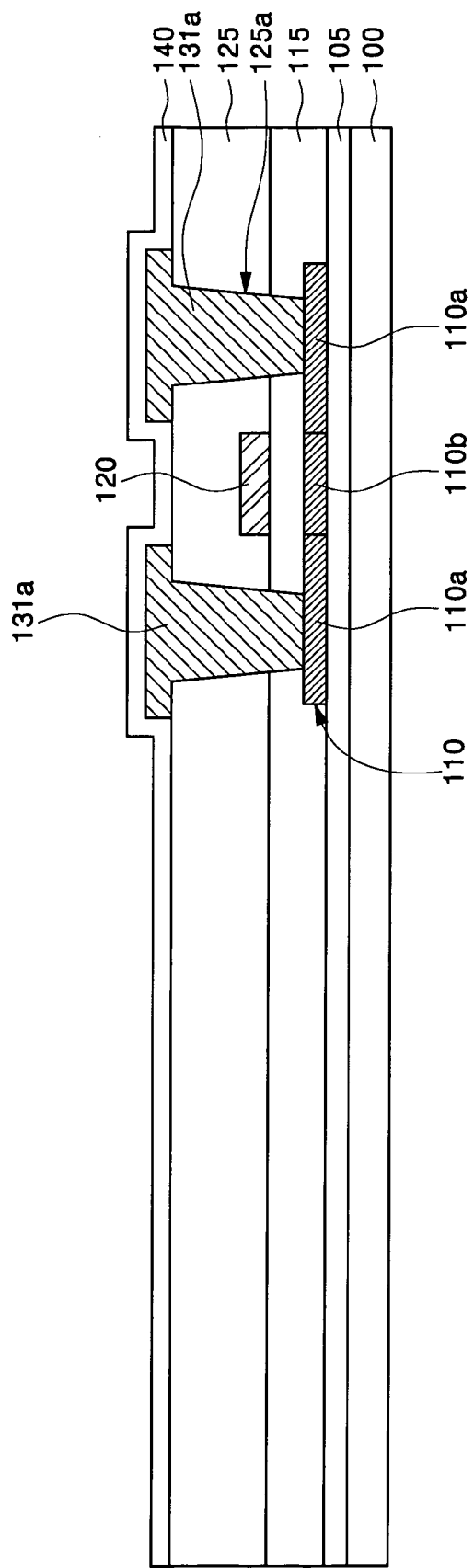
FIGS. 2A, 2B, 2C, and 2D are cross-sectional views for illustrating a method of fabricating a flat panel display device according to a first embodiment of the present invention.

As shown in FIG. 2A, a substrate 100 may be provided. The substrate 100 can be a glass or plastic substrate. A buffer layer 105 may be formed on the substrate 100. The buffer layer 105 can be formed of a silicon oxide layer, a silicon nitride layer, silicon oxynitride layer, a similar layer, or a multiple layers thereof. The buffer layer 105 may be a layer for protecting a TFT formed in the subsequent process from impurities such as alkali ions emitted from the substrate 100.

Preferably, an amorphous silicon layer may be deposited on the buffer layer 105, and may be crystallized to form a polysilicon layer. The crystallization of the amorphous silicon layer can be performed using Excimer Laser Annealing (ELA), Sequential Lateral Solidification (SLS), Metal Induced Crystallization (MIC), or Metal Induced Lateral Crystallization (MILC).

Next, the polysilicon layer may be patterned to form the semiconductor layer 110 on the substrate 100. A gate insulating layer 115 may then be formed on the overall substrate including the semiconductor layer 110. A gate electrode material may be deposited on the gate insulating layer 115 and may be patterned to form a gate electrode corresponding to a predetermined area of the semiconductor layer 110. Preferably, the gate electrode material may be a metal such as Al, an Al alloy, Mo, or a Mo alloy. More preferably, the gate electrode material may be MoW.

Next, ions may be doped into the semiconductor layer 110 using the gate electrode 120 as a mask to simultaneously form source/drain regions 110a in the semiconductor layer 110 as well as a channel region 110b interposed between the source/drain regions 110a. An interlayer 125 that covers the gate electrode 120 may then be formed. The interlayer 125 may be a silicon oxide layer, a silicon nitride layer, a silicon oxynitride layer, or multiple layers thereof. Source/drain contact holes 125a that each expose an end portion of the semiconductor layer 110 (such as the source/drain regions 110a) may be formed on the interlayer 125 and the gate insulating layer 115.

Next, a heat-resistant metal layer may be deposited on the substrate including the exposed semiconductor layer 110, and may be patterned to form a heat-resistant metal layer pattern 131a. The heat-resistant metal layer (which may have a high melting point and good thermal stability) may preferably include at least one metal layer such as, for example, a Cr layer, a Cr alloy layer, a Mo layer, or a Mo alloy layer. Preferably, the heat-resistant metal layer is a MoW alloy layer. Preferably, the heat-resistant metal layer pattern 131a may be at least 1000 Å thick.

Next, it may be desirable that a passivation layer 140 may be formed on the overall substrate including the heat-resistant metal layer pattern 131a. The passivation layer 140 may include, for example, a silicon oxide layer, a silicon nitride layer, silicon oxynitride layer, or multiple layers thereof. Preferably, the passivation layer 140 may include a silicon nitride layer. The substrate where the passivation layer 140 is deposited may be heat-treated at a temperature of about 380° C. The heat treatment may serve to activate the ions doped in the source/drain regions 110a. Further, when the passivation layer 140 includes a silicon nitride layer, the heat-treatment may diffuse hydrogen from the silicon nitride layer into the semiconductor layer 110. The hydrogen diffused into the semiconductor layer 110 can passivate a dangling bond within the semiconductor layer 110. In such a case, the heat-resistant metal layer pattern 131a may show stable characteristics even at the heat treatment temperature.

Figure 2B:
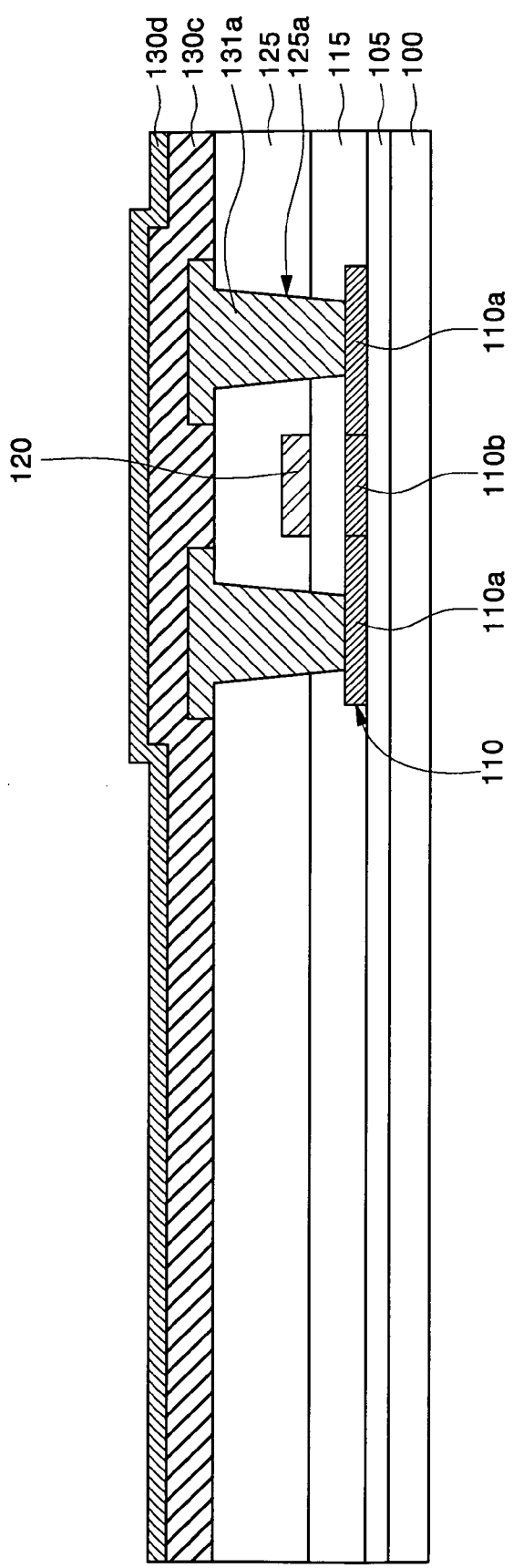

As shown in FIG. 2B, the passivation layer 140 may be blanket etched, thereby exposing the heat-resistant metal layer pattern 131a and the interlayer 125. Preferably, the blanket etching of the passivation layer 140 may be performed using dry etching.

Next, an Al-based metal layer 130c and a capping metal layer 130d may be deposited on the exposed heat-resistant metal layer pattern 131a.

The Al-based metal layer 130c may be a metal layer containing Al and having low specific resistance. Preferably, the Al-based metal layer 130c may include at least one metal layer such as, for example, an Al layer, an AlSi layer, an AlNd layer, and an AlCu layer. More preferably, the Al metal layer 130c may include an AlSi layer containing some ratio of silicon. The Al-based metal layer 130c may have merit, because it has a low specific resistance compared to the heat-resistant metal layer 131a. Unfortunately, it may have a low melting point is compared with the heat-resistant metal layer 131a, and thus may be thermally unstable.

Therefore, the Al-based metal layer 130c may preferably be deposited after performing the heat treatment process.

If an AlSi layer is used, the ratio of Si in the AlSi alloy may be about 0.1 to about 20 wt %. Preferably, the ratio may be between about 0.1 and about 5 wt %. Yet more preferably, the ratio may be between about 0.5 to about 2 wt %. As the ratio of the Si increases, the propensity of the layer to experience hillocks may decrease, but so may the conductivity. Accordingly, the ratio of Si in the AlSi alloy may be adjusted to strike an appropriate balance.

The Al-based metal layer 130c may not contact the semiconductor layer 110 due to the heat-resistant metal layer pattern 131a. The reason for this configuration is that the silicon in the semiconductor layer 110 can diffuse into the Al-based metal layer 130c when the Al-based metal layer 130c contacts the semiconductor layer 110. Such diffusion may generate a defect. Meanwhile, when the semiconductor layer 110 may be crystallized to form a polysilicon layer using a laser (or using ELA or SLS), the polysilicon layer can have a rough surface due to the surface protrusion. The heat-resistant metal layer pattern 131 a having a thickness of at least about 1000 Å may ensure that the surface protrusion of the polysilicon layer and the Al-based metal layer 130c do not contact.

The capping metal layer 130d may serve to prevent a defect such as a hillock of the Al-based metal layer 130c, and may preferably include a Ti layer or a Ta layer.

Figure 2C:
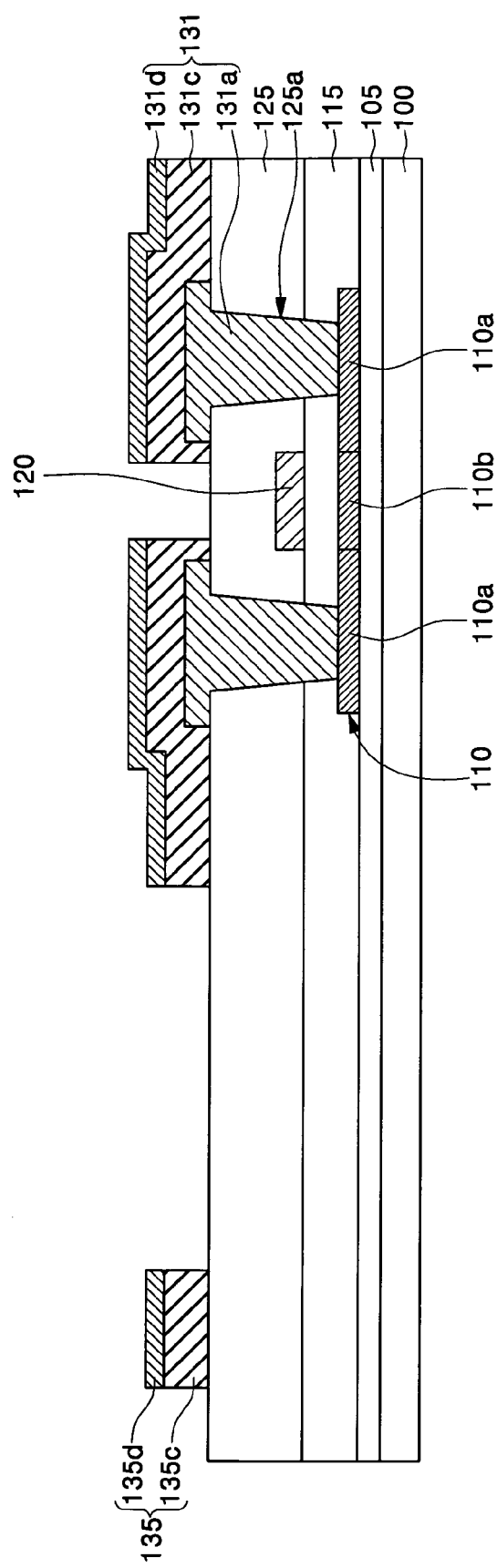

As illustrated in FIG. 2C, a photoresist pattern (not shown) may be formed on the capping metal layer 130d, and the capping metal layer 130d and the Al-based metal layer 130c may be etched using the photoresist pattern as a mask. This may form Al-based metal layer patterns 131c and capping metal layer patterns 131d. Thus, a source/drain electrode 131 having the heat-resistant metal layer pattern 131a, an Al-based metal layer pattern 131c, and a capping metal layer pattern 131d deposited on the substrate may be formed. At the same time, a signal wiring 135 having another Al-based metal layer pattern 135c and another capping meta layer pattern 135d may be formed on a predetermined area of the interlayer 125. Alternatively, the signal wiring 135 can be formed such that another heat-resistant metal layer pattern (not shown) may be placed below the Al-based metal layer pattern 135c. The wiring resistance of the signal wiring 135 can be significantly reduced due to the Al-based metal layer pattern 135c having the low specific resistance.

Figure 2D:
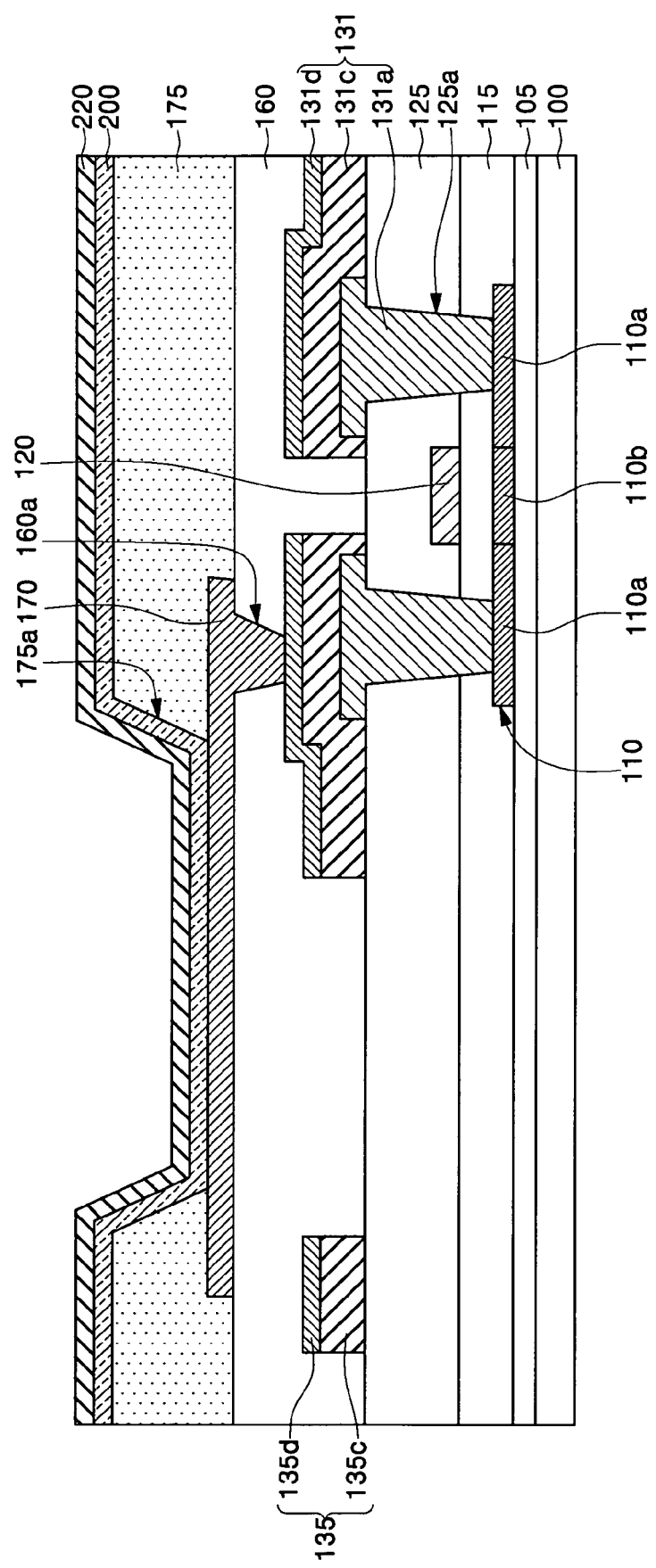

As shown in FIG. 2D, a via insulating layer 160 covering the source/drain electrodes 131 and the signal wiring 135 may be formed. The via insulating layer 160 can be formed of an organic layer, an inorganic layer, or multiple layers thereof. Next, a via hole 160a that exposes any one of the source/drain electrodes 131 may be formed in the via insulating layer 160. A pixel electrode material may be deposited on the exposed source/drain electrode 131, and may be patterned to form a pixel electrode 170 on the via insulating layer.

For a flat panel display device, the pixel electrode 170 may, for example, be formed of Indium Tin Oxide (ITO) or Indium Zinc Oxide (IZO).

The pixel electrode 170 may not contact the Al-based metal layer pattern 131c due to the capping metal layer pattern 131d, and thus an oxide layer between the Al-based metal layer pattern 131c and the pixel electrode 170 may not form. Accordingly, an increase of the contact resistance can be prevented between the pixel electrode 170 and the source/drain electrodes 131. To obtain this result, it may be desirable that the capping metal layer pattern 131d is about 100 Å thick.

Next, for an organic light-emitting display device, it may be desirable to form a pixel-defining layer 175 that covers the pixel electrode 170. The pixel-defining layer 175 can include a material such as, for example, benzocyclobutene (BCB), acrylic-based polymer, or imide-based polymer. An opening 175a that exposes the pixel electrode 170 may then be formed in the pixel-defining layer 175. Next, an organic functional layer 200 having at least an organic emission layer may be formed on the pixel electrode 170 exposed in the opening 175a. Preferably, the organic functional layer 200 may further include at least one of the following: hole injection layer (HIL), a hole transport layer (HTL), a hole blocking layer (HBL), an electron transport layer (ETL), or an electron injection layer (EIL). Finally, an opposite electrode 220 may be formed on the organic functional layer 200.

Alternatively, for a liquid crystal device, a lower alignment layer (not shown) that covers the pixel electrode 170 may be formed. Thus the fabrication of the lower substrate for the liquid crystal display device may be completed.

FIGS. 3A, 3B, 3C, and 3D are cross-sectional views for illustrating a method for fabricating a flat panel display device according to a second embodiment of the present invention.

Figure 3A:
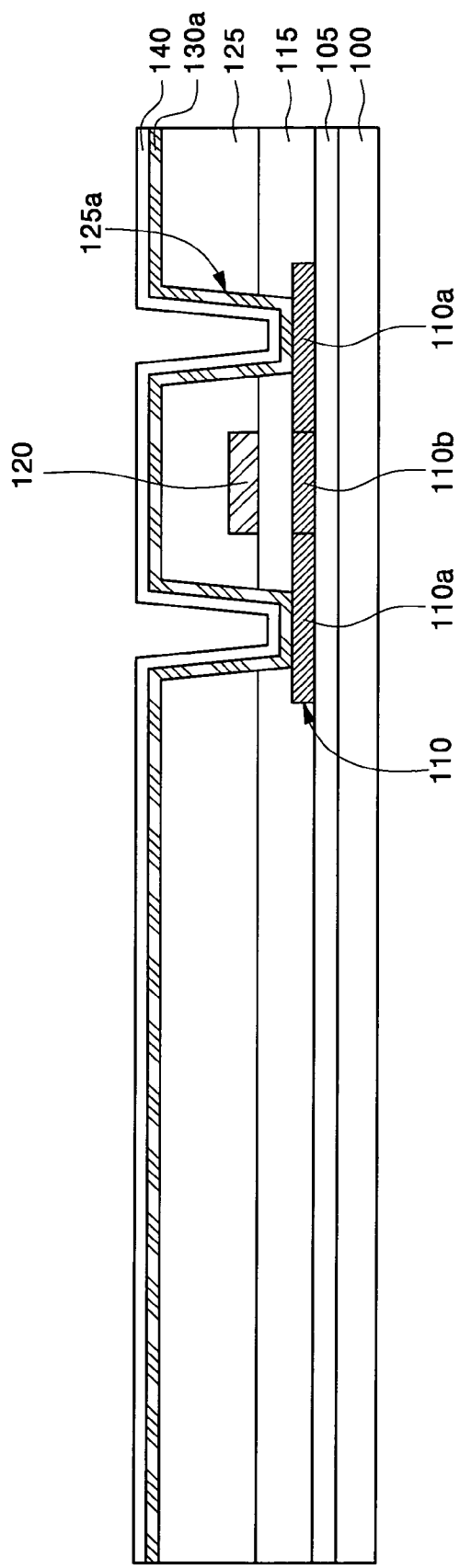

As shown in FIG. 3A, a substrate 100 may be provided. The substrate 100 can be a glass or plastic substrate. A buffer layer 105 may be formed on the substrate 100. The buffer layer 105 can include, for example, a silicon oxide layer, a silicon nitride layer, a silicon oxynitride layer or a multiple layer thereof.

Preferably, an amorphous silicon layer may be deposited on the buffer layer 105, and may be crystallized to form a polysilicon layer. The amorphous silicon layer can be crystallized by any suitable technique including, for example, the crystallization techniques previously discussed.

Next, the polysilicon layer may be patterned to form a semiconductor layer 110 on the substrate 100. A gate insulating layer 115 may then be formed on the overall substrate including the semiconductor layer 110. A gate electrode material may be deposited on the gate insulating layer 115 and may be patterned to form a gate electrode 120 corresponding to a predetermined area of the semiconductor layer 110. Preferably, the gate electrode material may be a metallic material such as, for example, Al, Al alloy, Mo, or Mo alloy. More preferably, the gate electrode material may be MoW.

Next, ions may be doped into the semiconductor layer 110 using the gate electrode 120 as a mask to form source/drain regions 110a in the semiconductor layer 110 and to define a channel region 110b interposed between the source/drain regions 110a. Next, an interlayer 125 that covers the gate electrode 120 may be formed. The interlayer 125 may, for example, be a silicon oxide layer, a silicon nitride layer, a silicon oxynitride layer, or multiple layers thereof. And then, source/drain contact holes 125a that each expose an end portion of the semiconductor layer 110 (namely the source/drain regions 110a) may be formed in the interlayer 125 and the gate insulating layer 115.

Next, a heat-resistant metal layer 130a may be deposited on the substrate including the exposed semiconductor layer in the source/drain contact hole 125a. It may be desirable that the heat-resistant metal layer 130a have a high melting point as well as thermal stability. Accordingly, one may select a material such as, for example, a Cr layer, a Cr alloy layer, a Mo layer, or a Mo alloy layer to serve as the heat-resistant metal layer 130a. Preferably, the heat-resistant metal layer may be a MoW alloy layer. Preferably, the heat-resistant metal layer 130a may be about 500 Å thick or less. More preferably, the heat-resistant metal layer 130a may be about 100 to about 300 Å thick.

It may be desirable that a passivation layer 140 be formed on the heat-resistant metal layer 130a. The passivation layer 140 may be formed of a silicon oxide layer, a silicon nitride layer, a silicon oxynitride layer, or multiple layers thereof. Preferably, the passivation layer 140 may be formed of the silicon nitride layer. Next, the substrate where the passivation layer 140 is deposited may be heat-treated at a temperature of about 380° C. The heat-treatment may serve to activate the ions doped in the source/drains regions 110a. Further, when the passivation layer 140 is formed in the silicon nitride layer, the heat-treatment may serve to diffuse hydrogen plentifully contained in the silicon nitride layer into the semiconductor layer 110. The hydrogen diffused into the semiconductor layer 110 can passivate a dangling bond within the semiconductor layer 110. In such a case, the heat-resistant metal layer 130a may show stable characteristics even at heat treatment temperatures.

Figure 3B:
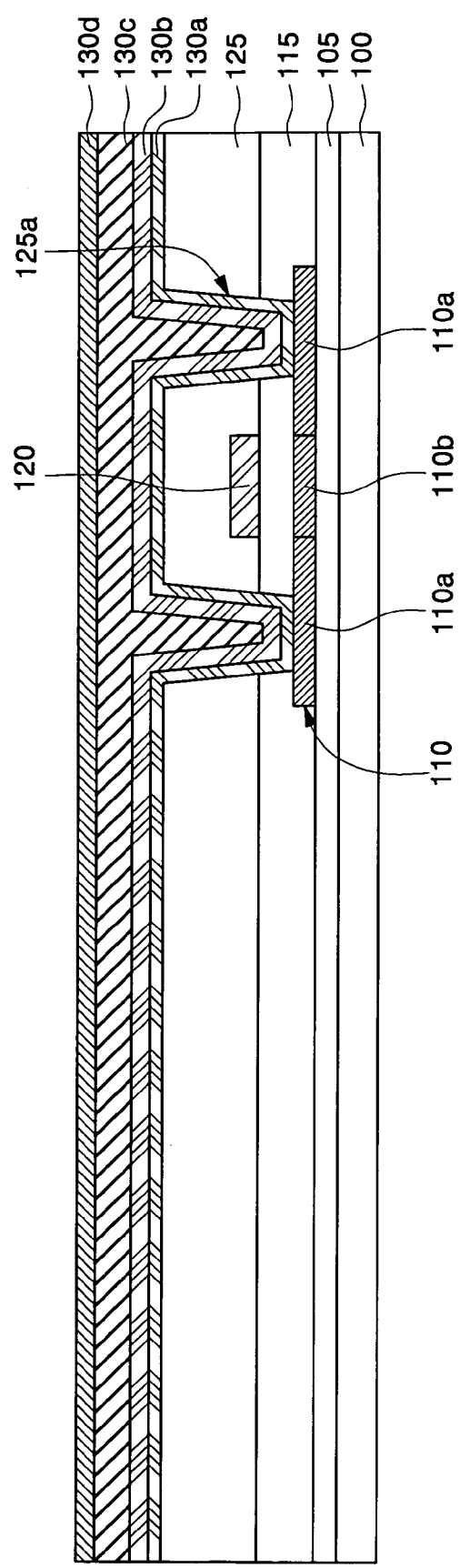

As shown in FIG. 3B, the passivation layer 140 may be blanket etched, thereby exposing the heat-resistant metal layer 130a. Preferably, the blanket etching of the passivation layer 140 may be performed using a dry etching process.

An Al-based metal layer 130c and a capping metal layer 130d may be deposited on the exposed heat-resistant metal layer 130a.

The Al-based metal layer 130c may be a metal layer containing Al, having a low specific resistance. Preferably, the Al-based metal layer 130c may be formed of at least one metal layer such as, for example, an Al layer, an AlSi layer, an AiNd layer, or an AlCu layer. More preferably, the Al-based metal layer 130c may be formed of AlSi containing some ratio of silicon. The Al-based metal layer 130c may have merit in that it has low specific resistance compared with the heat-resistant metal layer 130a. Unfortunately, it has a low melting point compared with the heat-resistant metal layer 130a, and is thus thermally unstable. Therefore, the Al-based metal layer 130c may be deposited after the heat treatment process is performed.

The Al-based metal layer 130c may not contact the semiconductor layer 110 due to the heat-resistant metal layer 130a. The reason for this configuration is that the silicon in the semiconductor layer 110 can diffuse into the Al-based metal layer 130c when the Al-based metal layer 130c contacts the semiconductor layer 110. Such contact-induced diffusion may generate a defect.

The semiconductor layer 110 may be crystallized to form polysilicon layer using a laser (or using ELA or SLS), and the polysilicon layer can have a rough surface due to the surface protrusion. The heat-resistant metal layer 130a about 500 Å thick or less may not sufficiently prevent the surface protrusion from contacting the Al-based metal layer 130c. Accordingly, it may be desirable that a diffusion barrier 130b be formed on the heat-resistant metal layer 130a before forming the Al-based metal layer 130c.

It may be desirable that the diffusion barrier 130b include a Ti layer or Ta layer. Further, it may be desirable that the diffusion barrier 130b may be formed 500 to 1500 Å thick. In certain circumstances the semiconductor layer 100 may be relatively smooth. This may occur when the semiconductor layer 110 is an amorphous silicon layer, or when it is polysilicon crystallized using MIC or MILC. In such circumstances where there is less surface protrusion, the diffusion barrier 130b may not be formed.

It may be desirable that the capping metal layer 130d include a Ti layer or Ta layer. The capping metal layer 130d may serve to prevent a defect such as a hillock of the Al-based metal layer 130c.

Figure 3C:
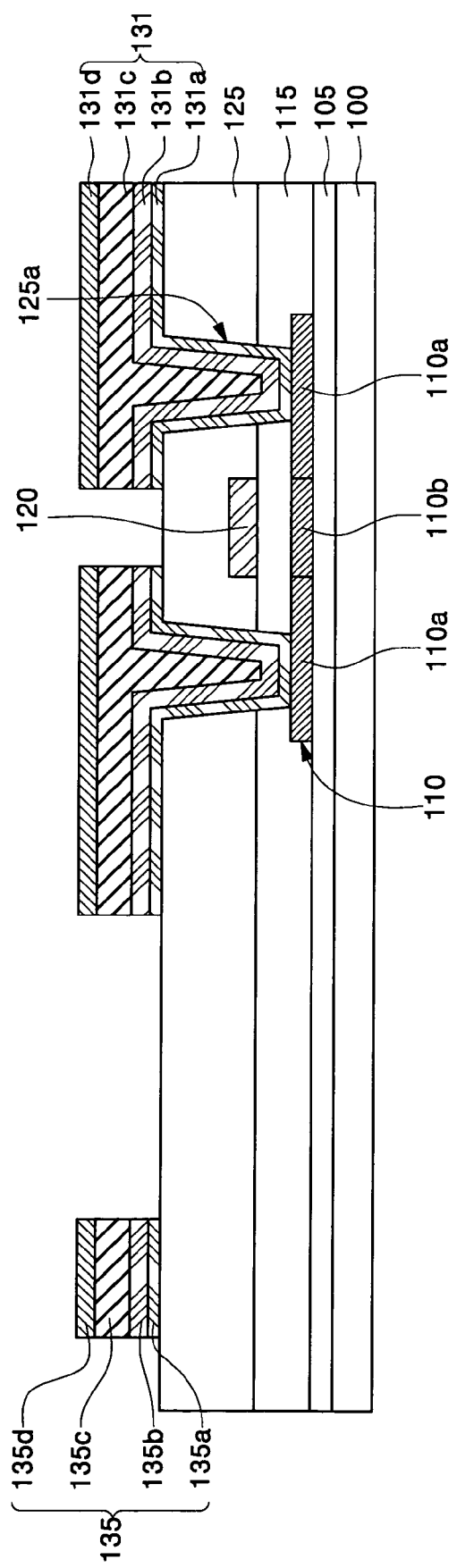

As shown in FIG. 3C, a photoresist pattern (not shown) may be formed on the capping metal layer 130d. The capping metal layer 130d, the Al-based metal layer 130c, the diffusion barrier 130b and the heat-resistant metal layer 130a may then be etched using the photoresist pattern as a mask. This etching process may produce heat-resistant metal layer patterns 131a, diffusion barrier patterns 131b, Al-based metal layer patterns 131c and capping metal layer patterns 131d deposited on the substrate. With this, a source/drain electrode 131 having a heat-resistant metal layer pattern 131a, a diffusion barrier pattern 131b, an Al-based metal layer pattern 131c, and a capping metal layer pattern 131d may be formed. The source/drain electrode 131 may contact the exposed source/drain region 110a. It may be desirable that the etching is performed using a dry etching process. The heat-resistant metal layer 130a may be about 500 Å thick or less, so that the capping metal layer 130d, the Al-based metal layer 130c, the diffusion barrier 130b and the heat-resistant metal layer 130a can be simultaneously etched, as described above.

Signal wiring 135 may be formed on the interlayer 125 while the source/drain electrodes 131 are formed. The signal wiring 135 may have a structure that includes another heat-resistant metal layer pattern 135a, another diffusion barrier pattern 135b, another Al-based metal layer pattern 135c, and another capping metal layer pattern 135d. The signal wiring 135 may have a significantly reduced wiring resistance due to the Al-based metal layer pattern 135c made of a material having low specific resistance.

As shown in FIG. 3D, a via insulating layer 160 that covers the source/drain electrodes 131 and the signal wiring 135 may be formed. The via insulating layer 160 can be formed of an organic layer, an inorganic layer, or multiple layers thereof. Next, a via hole 160a that exposes any one of the source/drain electrodes may be formed in the via insulating layer 160. A pixel electrode material may be deposited on the exposed source/drain electrode 131, and may be patterned to form the pixel electrode 170 on the via insulating layer 160.

The pixel electrode 170 need not contact the Al-based metal layer pattern 131c due to the capping metal layer pattern 131d. Thus an increase of the contact resistance between the pixel electrode 170 and the source/drain electrode 131 can be prevented. For this, it is desirable that the capping metal layer pattern 131d may be about 100 Å thick.

Further, for an organic light-emitting display device, it may be desirable to form a pixel-defining layer 175 that covers the pixel electrode 170. The pixel-defining layer 175 can include, for example, BCB, acrylic-based polymer, or imide-based polymer. Further, an opening 175a that exposes the pixel electrode 170 may be formed in the pixel-defining layer 175. Next, an organic functional layer 200 including at least organic emission layer may be formed on the pixel electrode 170 exposed in the opening 175a. It may be desirable that the organic functional layer 200 further include at least one of the following layers: a hole injection layer (HIL), a hole transport layer (HTL), a hole blocking layer (HBL), an electron transport layer (ETL), or an electron injection layer (EIL). Next, an opposite electrode 220 may be formed on the organic functional layer 200.

Alternatively, for a liquid crystal device, a lower alignment layer (not shown) that covers the pixel electrode 170 may be formed. This may be done so that the fabrication of the array substrate for the liquid crystal device may be completed.

As described above, according to the present invention, the source/drain electrodes may be formed to have a heat-resistant metal layer, an Al-based metal layer and a capping metal layer. This structure may beneficially result in a flat panel display device with low wiring resistance, thermal stability and improved contact resistance with the pixel electrode.

What is claimed is:

1. A flat panel display device, comprising:
   a substrate;
   a semiconductor layer located on the substrate;
   a gate electrode located on the semiconductor layer;
   an interlayer located on the gate electrode and the semiconductor layer and having a source/drain contact hole that exposes an end part of the semiconductor layer; and
   source/drain electrodes including at least a heat-resistant metal layer pattern, an Al-based metal layer pattern on the heat-resistant metal layer pattern, and a capping metal layer pattern on the Al-based metal layer pattern, deposited on the substrate,
   wherein the heat-resistant metal layer pattern, the Al-based metal layer pattern and the capping metal layer pattern are located on the exposed semiconductor layer, the heat-resistant metal layer pattern being arranged directly on the exposed semiconductor layer and comprising at least one metal layer selected from a group of a Cr layer, a Cr alloy layer, a Mo layer, and a Mo alloy layer, and
   wherein the heat-resistant metal layer pattern and the capping metal layer pattern are formed of different material.

2. The flat panel display device of claim 1, wherein the heat-resistant metal layer pattern comprises a MoW alloy layer.

3. The flat panel display device of claim 1, wherein the Al-based metal layer pattern comprises at least one metal layer selected from a group of an Al layer, an AlSi layer, an AlNd layer, and an AlCu layer.

4. The flat panel display device of claim 3, wherein the Al-based metal layer pattern comprises an AlSi layer.

5. The flat panel display device of claim 1, wherein the capping metal layer pattern comprises either a Ti layer or Ta layer.

6. The flat panel display device of claim 1, further comprising:
   a diffusion barrier pattern interposed between the heat-resistant metal layer pattern and the Al-based metal layer pattern.

7. The flat panel display device of claim 6, wherein the diffusion barrier pattern comprises either a Ti layer or a Ta layer.

8. The flat panel display device of claim 1, wherein the heat-resistant metal layer pattern is at least about 1000 Å thick.

9. A flat panel display device, comprising:
   a substrate;
   a semiconductor layer located on the substrate;
   a gate electrode located on the semiconductor layer;
   an interlayer located on the gate electrode and the semiconductor layer and having a source/drain contact hole that exposes an end part of the semiconductor layer; and
   source/drain electrodes including at least a heat-resistant metal layer pattern;
   an Al-based metal layer pattern on the heat-resistant metal layer pattern, and
   a capping metal layer pattern on the Al-based metal layer pattern, deposited on a substrate; and
   a diffusion barrier pattern interposed between the heat-resistant metal layer pattern and the Al-based metal layer pattern,
   wherein the heat-resistant metal layer pattern is about 500 Å or less thick the heat-resistant metal layer pattern being arranged directly on the exposed semiconductor layer and comprising at least one metal layer selected from a group of a Cr layer, a Cr alloy layer, a Mo layer, and a Mo alloy layer.

10. The flat panel display device of claim 1, wherein the semiconductor layer comprises a polysilicon layer.

11. The flat panel display device of claim 9, wherein the heat-resistant metal layer pattern comprises a MoW alloy layer.

12. The flat panel display device of claim 9, wherein the Al-based metal layer pattern comprises at least one metal layer selected from a group of an Al layer, an AlSi layer, an AlNd layer, and an AlCu layer.

13. The flat panel display device of claim 12, wherein the Al-based metal layer pattern comprises an AlSi layer.

14. The flat panel display device of claim 9, wherein the capping metal layer pattern comprises either a Ti layer or Ta layer.

15. The flat panel display device of claim 9, wherein the diffusion barrier pattern comprises either a Ti layer or a Ta layer.

* * * * *